(12) United States Patent
Suzuki et al.

(10) Patent No.: US 7,575,358 B2
(45) Date of Patent: Aug. 18, 2009

(54) PLANAR ILLUMINATION DEVICE

(75) Inventors: Shingo Suzuki, Kitasaku-gun (JP); Daisuke Nakayama, Kitasaku-gun (JP)

(73) Assignee: Minebea Co., Ltd., Kitasaku-gun (JP)

( * ) Notice: Subject to any disclaimer, the term of this patent is extended or adjusted under 35 U.S.C. 154(b) by 42 days.

(21) Appl. No.: 11/884,660

(22) PCT Filed: Jan. 13, 2006

(86) PCT No.: PCT/JP2006/000375

§ 371 (c)(1),
(2), (4) Date: Aug. 20, 2007

(87) PCT Pub. No.: WO2006/087879

PCT Pub. Date: Aug. 24, 2006

(65) Prior Publication Data

US 2008/0259641 A1    Oct. 23, 2008

(30) Foreign Application Priority Data

Feb. 18, 2005    (JP) .............................. 2005-041600

(51) Int. Cl.
*F21V 8/00* (2006.01)
(52) U.S. Cl. .................. 362/613; 362/612; 362/621
(58) Field of Classification Search .......... 362/612, 362/613, 611, 621, 555, 800, 608
See application file for complete search history.

(56) References Cited

U.S. PATENT DOCUMENTS

| 3,892,959 A | * | 7/1975 | Pulles | 362/613 |
| 6,065,845 A | * | 5/2000 | Miyazaki | 362/26 |
| 6,676,268 B2 | * | 1/2004 | Ohkawa | 362/613 |
| 2005/0088837 A1 | * | 4/2005 | Leu et al. | 362/31 |
| 2005/0254771 A1 | | 11/2005 | Yamashita et al. | |

FOREIGN PATENT DOCUMENTS

| CN | 1653296 A | | 8/2005 |
| JP | A 10-199316 | | 7/1998 |
| JP | 10-247412 | * | 9/1998 |
| JP | A 10-247411 | | 9/1998 |
| JP | A 10-293202 | | 11/1998 |
| JP | A 2002-196151 | | 7/2002 |
| JP | A 2002-217459 | | 8/2002 |
| JP | A 2004-111352 | | 4/2004 |
| JP | A 2004-233938 | | 8/2004 |
| WO | WO 03/098100 A1 | | 11/2003 |

* cited by examiner

*Primary Examiner*—Laura Tso
(74) *Attorney, Agent, or Firm*—Oliff & Berridge, PLC

(57) ABSTRACT

Thinning of a planar illumination device using an LED is accelerated while higher and more uniform brightness is promoted.

An LED 24 constituting the planar illumination device has no lamp house, but a translucent resin that seals an LED chip 25 is exposed. An outline of the translucent resin is formed as a projecting portion 28 comprising a continuous curved surface. Moreover, on a side end face 12a opposed to the LED 24 of a light guide plate 12, a notch portion 12d following the outline of the projecting portion 28 is formed, and on this notch portion 12d, a prism row 101 made of a plurality of unit prisms extending in a direction crossing the light guide plate 12 is formed.

9 Claims, 10 Drawing Sheets (a)    (b)

(a)  (b)

FIG. 6
| SHAPE | H/R | θ (deg.) | ξ |
|---|---|---|---|
| FLAT | 0 | 147 | 86% |
| R2.0-H0.4 | 0.2 | 155 | 90% |
| R1.33-H0.4 | 0.3 | 158 | 93% |
| R1.0-H0.4 | 0.4 | 157 | 96% |
| R0.9-H0.4 | 0.444 | 155 | 98% |
| R0.8-H0.4 | 0.5 | 150 | 99% |
| R0.67-H0.4 | 0.6 | 139 | 100% |
| R0.6-H0.4 | 0.667 | 133 | 100% |
| R0.9-H0.9 | 1 | 101 | 100% |
| R0.7-H1.0 | 1.429 | 51 | 86% |
FIG. 7
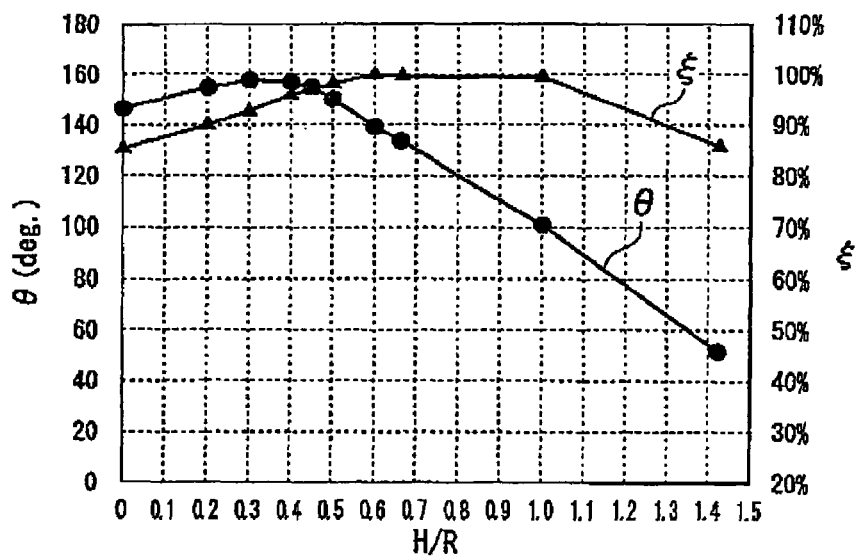
FIG. 8
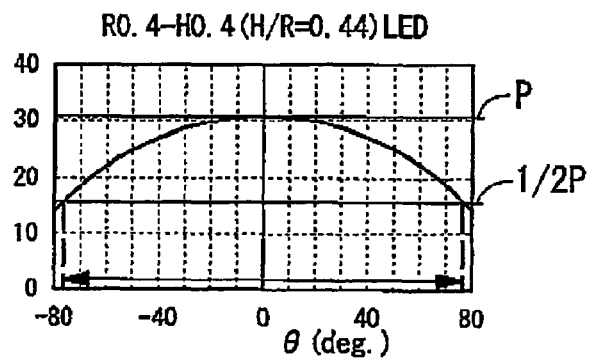

FIG. 13
(a)
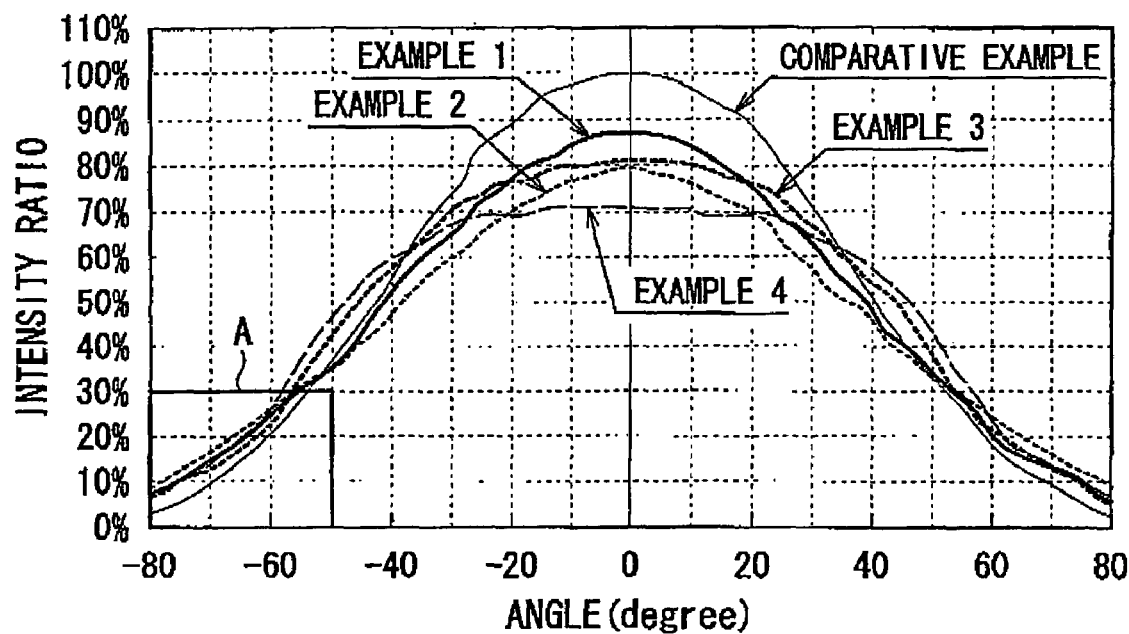
(b)
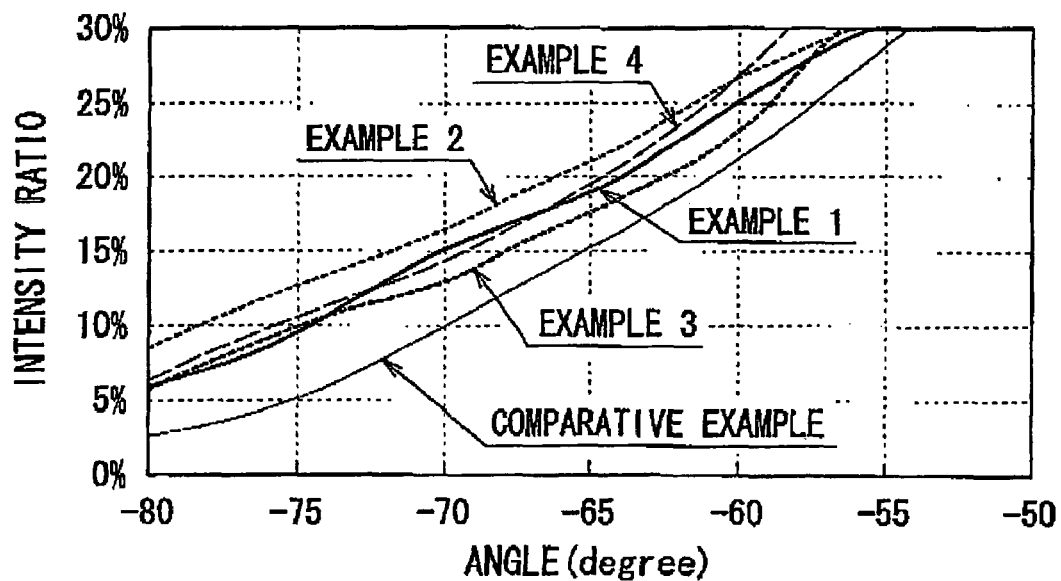

FIG. 14
(a)
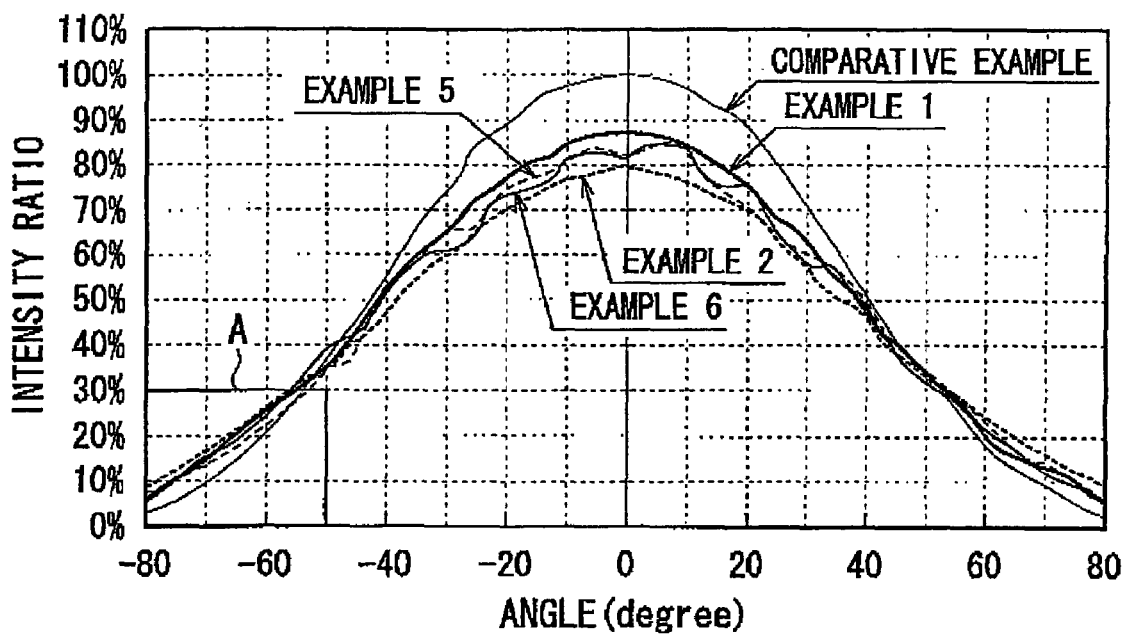
(b)
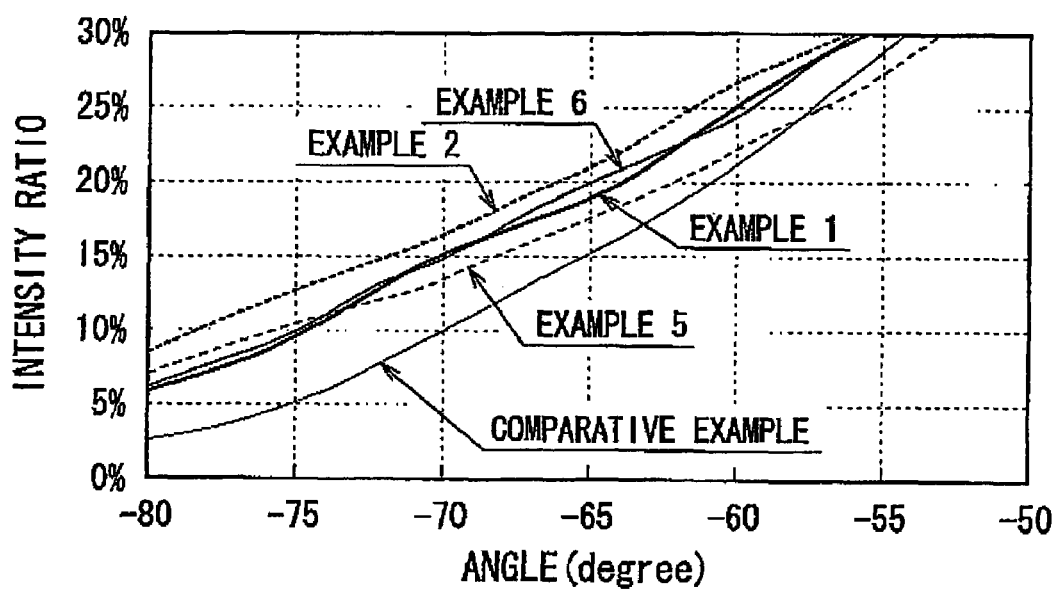

PLANAR ILLUMINATION DEVICE

TECHNICAL FIELD

The present invention relates to a side-light type planar illumination device and particularly to a planar illumination device used as illuminating means of a liquid crystal display device.

BACKGROUND ART

Liquid crystal display devices are widely used in display means or the like of electronic equipment at present but since liquid crystal display devices are not self-luminous, illuminating means for ensuring visibility at night and in dark places are needed. A planar illumination device has been used as such illuminating means.

As one type of the planar illumination device, a side-light type planar illumination device is widely used. The side-light type planar illumination device comprises a light guide plate with light transmittance, a rod-state light source arranged on a side end face of the light guide plate or one or more point-state light sources as basic elements. As a recent trend, in accordance with an increase in the application of planar illumination devices to small-sized electronic equipment such as personal digital assistants, a planar illumination device of the type provided with a point-like light source capable of simplification of a driving circuit is used. FIG. 15 schematically shows a light guide plate 12 and a plurality of point-like light sources (LED) 14 arranged on a side end face of the light guide plate 12 in a side-light type planar illumination device 10.

In the planar illumination device 10 using the point-like light source 14 shown in FIG. 15, since light irradiated from the LED 14 to the light guide plate 12 has a given directivity, the vicinity of the LED 14 of the light guide plate 12 illuminated by the LED 14 is clearly divided into a bright part A and a dark part B. As a measure for solving a difference between the bright part and the dark part so as to obtain average brightness, an optical diffused reflection pattern 12b such as a fine prism row is provided on an opposite face 12a opposed to the LED 14 of the light guide plate 12 as shown in FIG. 16, an LED 16 in which a part of an armor member is made into a projecting portion 16a in a half-column state is used and a semi-cylindrical recess portion 12c to be fitted with the projecting portion 16a is provided at the light guide plate 12 so as to emit light of an LED chip 17 radially from a slit formed at the projecting portion 16a (See Patent Document 1, for example) as shown in FIG. 17, or moreover, a lamp house 20 covering an LED chip 19 is provided as in an LED 18 shown in FIG. 18 so as to control light directivity by changing a height of the lamp house 20 or an inclination angle of an inclined face 20a (See Patent Document 2, for example). In FIG. 18, reference numeral 22 denotes a translucent resin for sealing the LED chip 19 in the lamp house 20.

Patent Document 1: Japanese Unexamined Patent Application Publication No. 10-199316 ([0023], [0026] to [0028])

Patent Document 2: Japanese Unexamined Patent Application Publication No. 2002-217459 (Claim 1, FIG. 1)

DISCLOSURE OF INVENTION

Problems to be Solved by the Invention

Since the planar illumination device using the above LED has a role as illuminating means of a liquid crystal display device, further reduction in the thickness is in demand all the time while promoting higher and more uniform brightness. In this regard, in the planar illumination device using the LED 14 whose front light emitting face is flat as shown in FIG. 16, many beams in the light emitted from the LED chip sealed inside the LED are fully reflected by the front flat face, and since the forward outgoing light amount ratio is deteriorated (See FIG. 6) as will be described later, there is a limitation in promotion of high brightness. Also, in the planar illumination device using the LED 16 of the type that light is emitted from the half-column projecting portion 16a as shown in FIG. 17, the light beams fully reflected by the light emitting face is decreased, and as will be described later, the forward outgoing light amount ratio is improved (See FIG. 6) but on the contrary, a half width of the LED is narrowed by a lens effect (See FIG. 6), which leads to a problem that uniform brightness can not be realized. On the other hand, as shown in FIG. 18, in the planar illumination device using the LED 18 provided with the lamp house 20 covering the LED chip 19, the thickness of the lamp house 20 causes an obstacle to thinning of the planar illumination device.

The present invention was made in view of the above problems and has an object to further reduce the thickness of the planar illumination device using the LED while promoting higher and more uniform brightness.

Means for Solving the Problems

In order to solve the above problems, in the planar illumination device according to the present invention comprising a plate-like light guide plate and an LED arranged on a side end face of the light guide plate, the LED has no lamp house, a translucent resin that seals an LED chip is exposed, an outline of the translucent resin comprises a continuous curved surface projecting to the front in the light emitting direction of the LED, a notch portion following the outline of the projecting portion comprising the continuous curved surface is formed on the side end face opposed to the LED of the light guide plate, and a prism row constructed from a plurality of unit prisms extending in a direction crossing the light guide plate is provided on the surface of the notch portion.

According to the present invention, since the LED has no lamp house but the translucent resin that seals the LED chip is exposed, increase by the thickness of the lamp house is not generated but reduction in the thickness of the planar illumination device is promoted. Moreover, since the notch portion following the outline of the projecting portion is formed on the side end face opposed to the LED of the light guide plate and the prism row constructed from a plurality of the unit prisms extending in the direction crossing the light guide plate are provided on the surface of the notch portion, in addition to close contact with the projecting portion of the translucent resin of the LED and the light guide plate, incident light is diffused by the prism row and the light emission distribution of the light incident from the LED to the light guide plate is widened so that the light emission distribution equivalent to the light by the single LED can be realized and contribution is made to more uniform brightness of the planar illumination device.

In the present invention, the unit prism is formed by a projecting streak or a recess streak and the side face of the projecting streak or the recess streak comprises a flat face, a curved face or combination of them. In one form of the present invention, the prism row is formed by arranging the unit prisms projected or recessed in a direction of a center of curvature of the notch portion along the circumferential direction of the notch portion. In another form, the prism row is formed by arranging the unit prisms projected or recessed in a direction crossing the side end face opposed to the LED along the circumferential direction of the notch portion.

Also, the prism row may include the unit prism with the outline of the section substantially in a triangular shape or the unit prism with the outline of the section substantially in an arc or may include the unit prism with the outline of the section made of at least one straight line and an arc connected to the straight line.

In the present invention, by setting the shape and arrangement of the prism row provided at the notch portion of the light guide plate, the light incident from the LED to the light guide plate is diffused in a wide angle and at the same time, it becomes possible to distribute light with a desired intensity in a desired direction according to the shape and the arrangement of the above predetermined prism row.

Moreover, in the present invention, if a reflector is arranged along the side face of the LED in a direction parallel with the light guide plate of the LED, most of leaked light emitted from other than the front face can be guided to the light guide plate.

Also, in the present invention, the LED preferably has a value obtained by dividing the projecting height by a radius of the projecting portion in a range of 0.3 or more and 0.6 or less and is formed with the radius of the projecting portion having a value obtained by multiplying the length when the LED chip is projected in the direction crossing the light guide plate by 1.5 or more.

Since the outline of the translucent resin has the above predetermined shape, the forward outgoing light amount ratio of the LED contributing to higher brightness of the planar illumination device and an angle of the emission light of the LED contributing to more uniform brightness of the planar illumination device can be balanced at a higher dimension while the LED chip can be fully sealed in the translucent resin.

ADVANTAGES OF THE INVENTION

Since the present invention comprises as above, the thickness of the planar illumination device using the LED can be further reduced while higher and more uniform brightness is promoted. Also, since the light emission distribution of the light incident to the light guide plate can be widened, while the brightness of the planar illumination device is maintained, uniform brightness can be sufficiently achieved even in the case of the planar illumination device with the single LED arranged on the side end face of the light guide plate.

BRIEF DESCRIPTION OF THE DRAWINGS

FIG. 1 are perspective views illustrating an essential part of a planar illumination device according to an embodiment of the present invention, in which FIG. 1(a) is an exploded view and FIG. 1(b) is a view showing the device in a connected state.

FIG. 5 are views illustrating the LED chip sealed in the LED shown in FIG. 2, in which FIG. 5(a) is a plan view and FIG. 5(b) is a side view.

FIG. 6 is a chart of a half width θ indicating an angle of outgoing light and a forward outgoing light amount ratio ξ.

FIG. 7 is a graph based on the values in FIG. 6.

FIG. 8 is an explanatory diagram for explaining the half width in FIGS. 5, 6.

FIG. 9 are views illustrating one form of a notch portion formed at the light guide plate of the planar illumination device according to the embodiment of the present invention, in which FIG. 9(a) is a plan view illustrating a state where the LED is arranged and FIG. 9(b) is a plan view illustrating the notch portion in an enlarged manner.

FIG. 12 are perspective views illustrating an example where a reflector is arranged along a side face in a direction parallel with the light guide plate of the LED in the planar illumination device according to the embodiment of the present invention, in which FIG. 12(a) is an exploded view and FIG. 12(b) is a view showing the device in a connected state.

FIG. 13 are graphs showing light emission distribution of the embodiments 1 to 4 according to the present invention along with a comparative example, in which FIG. 13(a) is an entire view and FIG. 13(b) is an enlarged view of A section in FIG. 13(a).

FIG. 14 are graphs showing light emission distribution of the embodiments 1, 2, 5, 6 according to the present invention along with a comparative example, in which FIG. 14(a) is an entire view and FIG. 14(b) is an enlarged view of A section in FIG. 14(a).

REFERENCE NUMERALS

Figure 1:
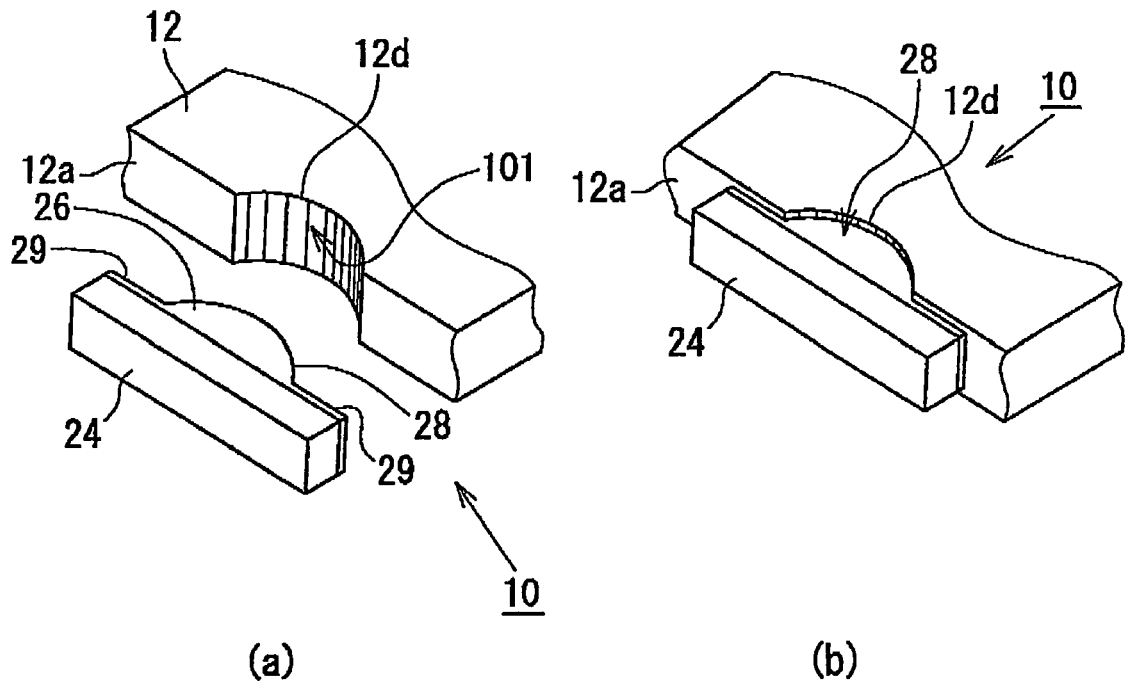

10 Planar illumination device
12 Light guide plate
12a Side end face opposed to LED
12d Notch portion
24 LED
24a, 24b Side face in direction parallel with light guide plate
25 LED chip
26 Translucent resin
28 Projecting portion
36 Reflector
101, 101', 101" Prism row
101a, 101b, 101c Unit prism

BEST MODE FOR CARRYING OUT THE INVENTION

Embodiments of the present invention will be described below based on the attached drawings. Here, portions equivalent to or corresponding to the prior art are shown by the same reference numerals and detailed description will be omitted.

FIG. 1 are perspective views illustrating an essential part of a planar illumination device according to an embodiment of the present invention, in which FIG. 1(a) is an exploded view and FIG. 1(b) is a view showing the device in a connected state. A planar illumination device 10 comprises, similarly to a conventional planar illumination device shown in FIG. 15, a plate-like light guide plate 12 and an LED 24 arranged on a side end face 12a of the light guide plate 12.

Figure 2:
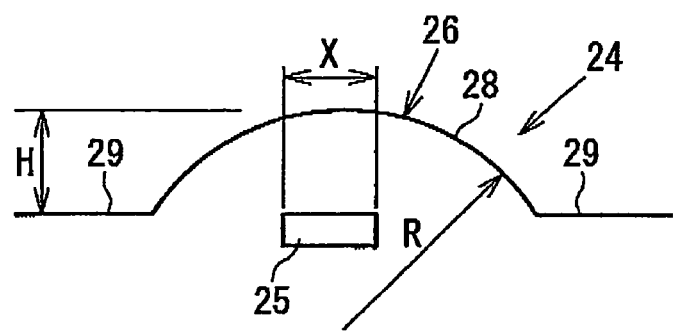
FIG. 2 is a diagram schematically showing an outline of a translucent resin that seals an LED chip of an LED in the planar illumination device according to the embodiment of the present invention.

In this embodiment, the LED 24 has no lamp house but has a structure in which a translucent resin 26 that seals an LED chip 25 (See FIGS. 2 to 4) is exposed. An outline of the translucent resin 26 has a projecting portion 28 comprising a continuous curved surface projecting forward in a light emitting direction of the LED 24. In the shown example, the projecting portion 28 is formed integrally with a base portion 29 comprising a rectangular solid translucent resin, which is long in a direction parallel with the light guide plate (direction parallel with the surface of the figure of the light guide plate 12 shown in FIG. 15) and short in a direction crossing the light guide plate (direction crossing the surface of the figure of the light guide plate 12 shown in FIG. 15). Moreover, the continuous curved surface constituting the projecting portion 28 comprises a cylindrical face having a given radius R in the illustrated example.

A notch portion 12d following the outline of the projecting portion 28 is formed on the side end face 12a of the light guide plate 12 opposed to the LED 24, and on the surface of the notch portion 12d, a prism row 101 (the prism row 101 in FIG. 1 is schematically shown by a plurality of straight lines and its specific mode will be described later referring to FIGS. 9 to 11) constructed from a plurality of unit prisms extending in a direction crossing the light guide plate 12 is formed. In this embodiment, the LED 24 is arranged with the projecting portion 28 fitted in the notch portion 12d.

Next, configuration of the LED 24 according to this embodiment will be described in detail.

Figure 3:
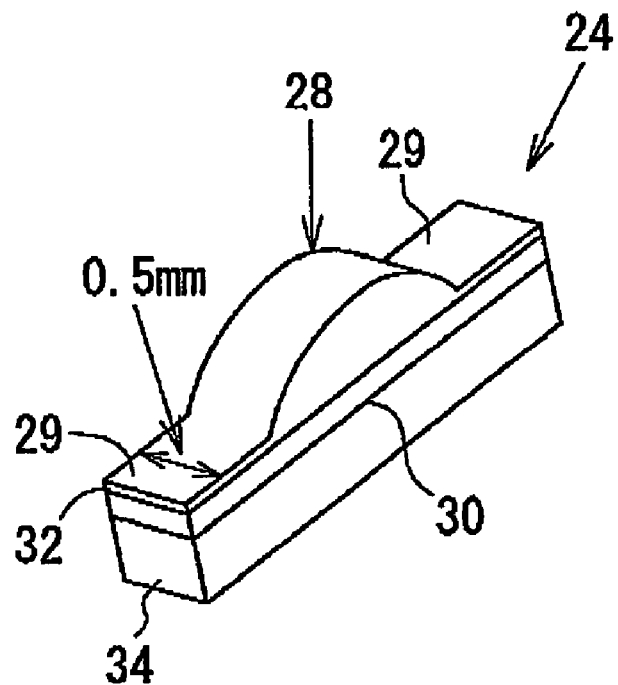
FIG. 3 is a perspective view of an appearance illustrating a specific structural example of the LED shown in FIG. 2.
Figure 4:
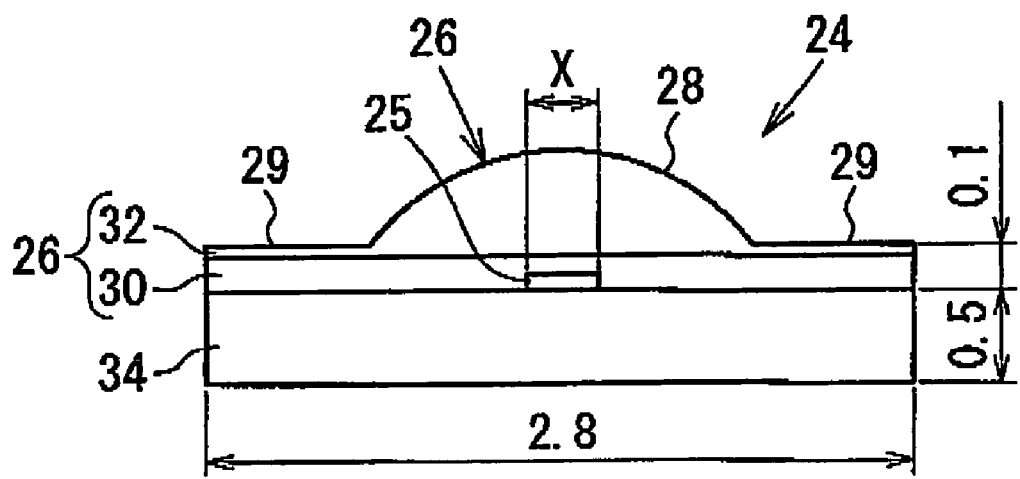
FIG. 4 is a sectional view illustrating a specific structural example of the LED shown in FIG. 2.
Figure 5:
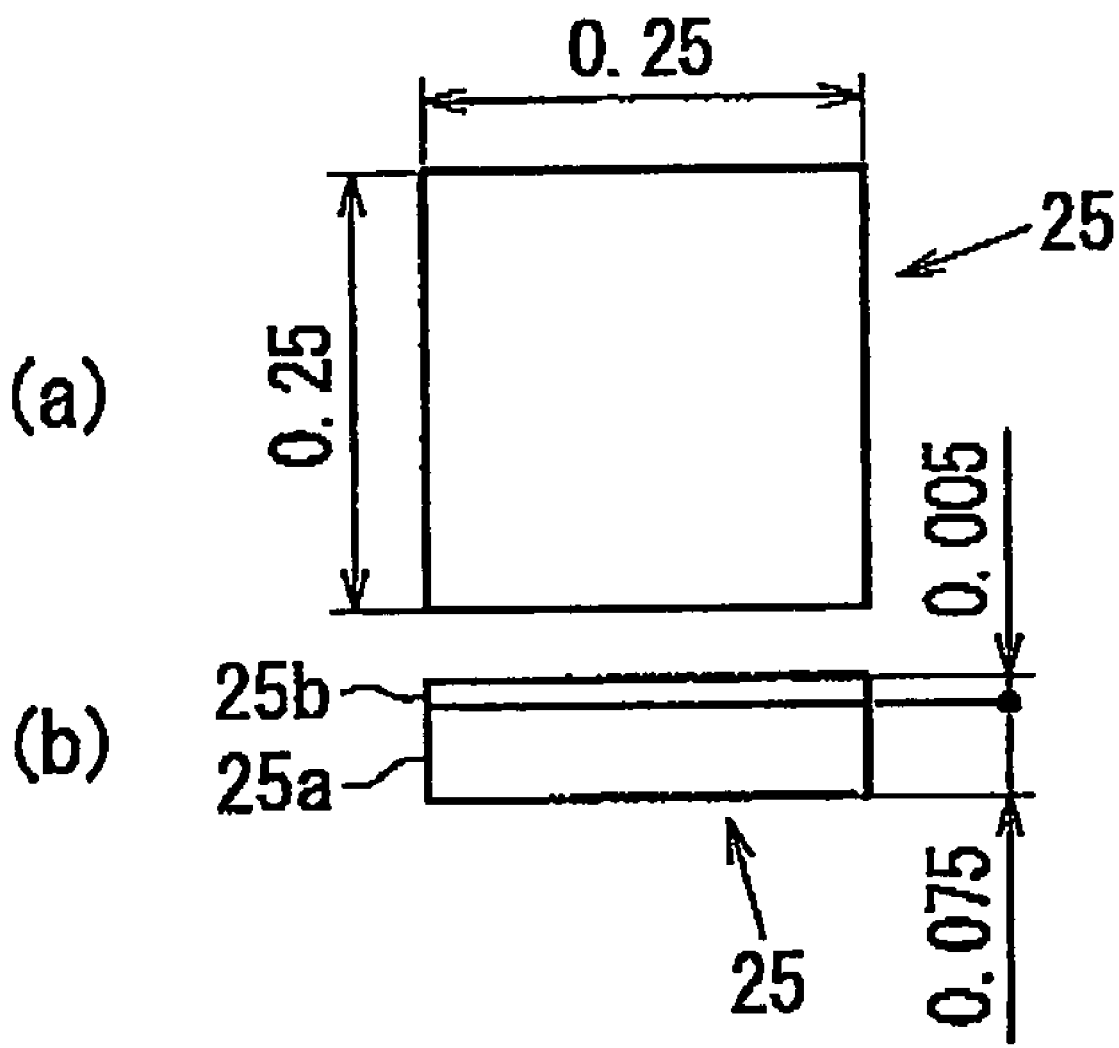

The translucent resin 26 of the LED 24 has, as shown in FIGS. 3 and 4, a structure in which the periphery of the LED chip 25 is sealed by a layer 30 in which yttrium, aluminum, garnet (YAG) particles activated by cerium, which is a yellow luminescent material, are mixed in a hard silicon resin, and a transparent hard silicon resin layer 32 is further added on its periphery (upper layer). Therefore, in the shown example, the projecting portion 28 is formed on the transparent hard silicon resin layer 32. Also, as the LED chip 25, as shown in FIG. 5, a light emitting layer 25b made of lamination of a nitride compound semiconductor such as GaN, GaAlN or the like on a sapphire substrate 25a (blue luminescent device) is used. The LED chip 25 is, as shown in FIG. 4, bonded onto a substrate (PCB) 34 having an electrode portion, and anode and cathode electrodes and a wiring pattern on the substrate 34 formed on the LED chip 25 have a structure connected by a gold line of Φ20 μm. FIGS. 3 to 5 show a specific example of the dimensions of the LED 24 and the LED chip 25 (in units of mm).

In the LED 24 having the above structure, since a part of blue light emission of the LED chip 25 is absorbed by the YAG particles (luminescent body) of the YAG particle mixed layer 30 and converted to a wavelength longer than that of during light emission of the LED chip 25 so as to generate color mixture with the blue light luminescence of the LED chip 25, which emits a quasi-white light. The YAG particle mixed layer 30 of the translucent resin 26 is not limited to the configuration fully separated from the transparent layer 32 into two layers as shown in FIGS. 3 and 4, but such a structure can be employed that the YAG particle mixed layer 30 is formed only on the periphery of at least the blue light emitting LED chip 25 and its periphery is entirely covered by the transparent layer 32.

It is only necessary for the translucent resin 26 to be a transparent resin having heat resistance and a thermosetting transparent resin such as a transparent epoxy resin, for example, can be applied other than the above hard silicon resin. A thermoplastic resin with high heat resistance and an inorganic material such as glass can be also applied as necessary.

In this embodiment, when the projecting height (projecting height from the base portion 29) of the projecting portion 28 is H, the LED 24 is formed in a range of $0.3 \leq H/R \leq 0.6$, or preferably in a range of $0.4 \leq H/R \leq 0.5$. Also, the radius of the projecting portion 28 is formed to have a value obtained by multiplying a length when the LED chip 25 is projected in a direction crossing the light guide plate (length in a direction parallel with the longitudinal direction of the LED 24 and indicated by reference symbol X in FIGS. 2 and 4) by 1.5 or more ($1.5X \leq R$).

FIG. 6 is a chart showing changes of a half width θ indicating an angle of outgoing light of the LED and forward outgoing light amount ratio ξ by varying the value of H/R of the LED 24 used in the planar illumination device according to the embodiment of the present invention. FIG. 7 is a graph based on the values in FIG. 6. With regard to the "half width θ", as shown in FIG. 8, an angle of outgoing light when an outgoing intensity ½ P can be obtained, which is a half of a peak value P of the outgoing intensity of the outgoing light (normally it appears in the vicinity of θ=0°, which is a direction of the front of the LED 24), is referred to as the "half width" and this is a value generally used as an index of outgoing light distribution. FIG. 8 exemplifies the half width θ of the LED with R=0.9 mm, H=0.4 mm and H/R=0.44.

Also, with regard to the "forward outgoing light amount ratio ξ", when light in all the directions emitted from the LED is classified into light contributing to higher brightness of the planar illumination device emitted to the front of the LED (including spaces above and below) and light not contributing to higher brightness of the planar illumination device emitted to the rear of the LED (including the spaces above and below), the "forward outgoing light amount ratio ξ" is a value indicating a ratio of the former.

Figure 15:
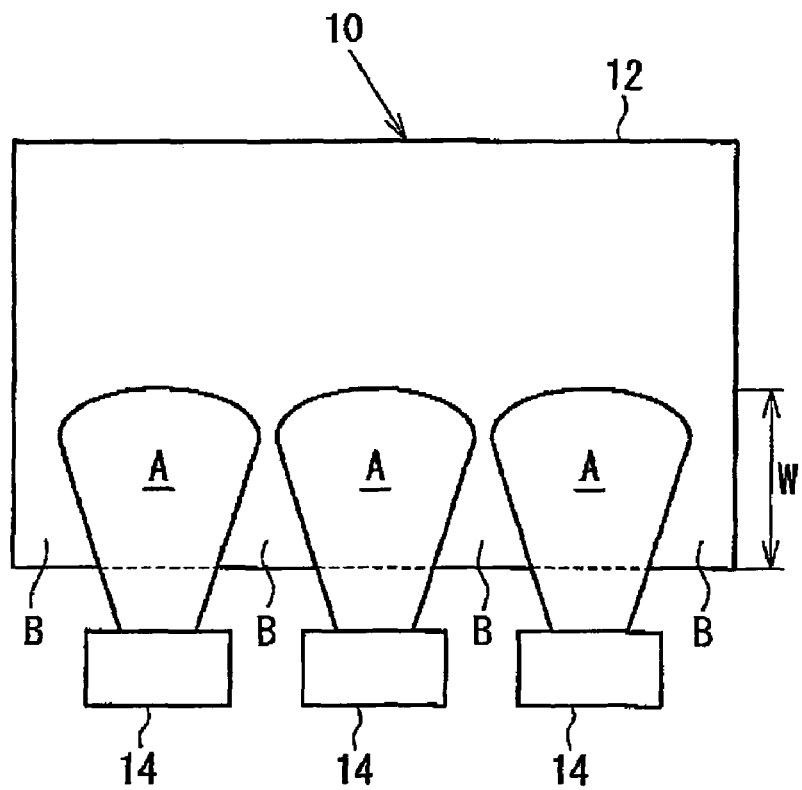
FIG. 15 is a plan view illustrating basic configuration of a conventional planar illumination device using an LED.
Figure 16:
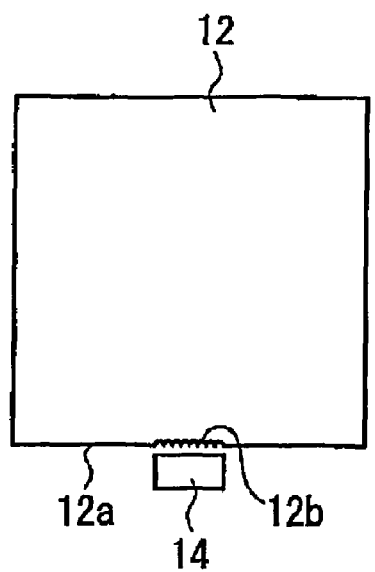
FIG. 16 is a plan view illustrating a planar illumination device for which a measure to obtain average brightness is taken.
Figure 17:
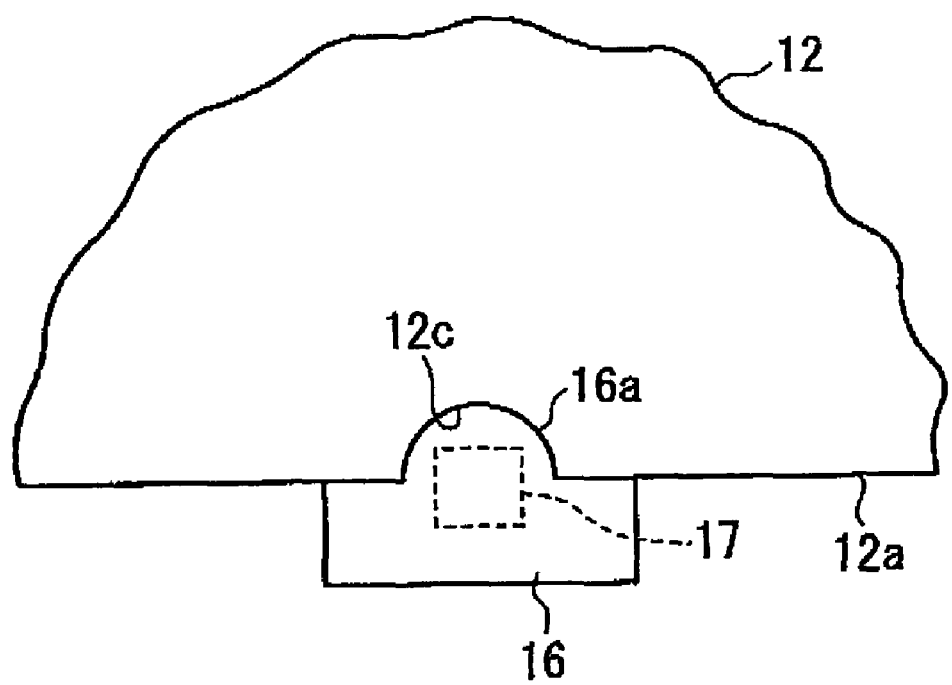
FIG. 17 is a plan view illustrating a conventional planar illumination device for which a measure to obtain average brightness is taken.
Figure 18:
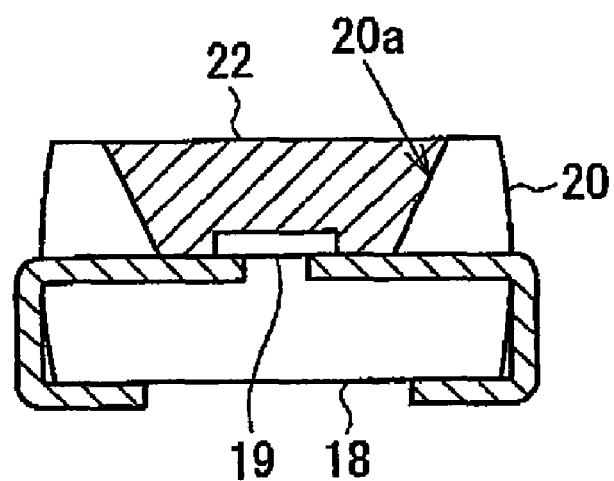
FIG. 18 is a plan view illustrating a conventional LED for which a measure to obtain average brightness is taken.

As obvious from these specific numeral examples, in the range of $0.3 \leq H/R \leq 0.6$, sufficiently favorable values are obtained both for the half width θ and the forward outgoing light amount ratio ξ. Also, for a balance at a higher level between the half width θ and the forward outgoing light amount ratio ξ in order to realize higher and more uniform brightness of the planar illumination device, the range of $0.4 \leq H/R \leq 0.5$ is preferable. In the case of H/R=0 (LED 14 with the front light emitting face in the flat shape as shown in FIG. 15), the value of the forward outgoing light amount ratio 4 drops to the lowest level, and it is understood that higher brightness of the planar illumination device can not be satisfactorily realized. On the other hand, in the case of H/R=1 (LED 16 of the type emitting light from a half-columnar projecting portion 16a as shown in FIG. 16), the value of the half width θ is markedly lowered, and it is understood that uniform brightness of the planar illumination device is difficult to realize.

Next, a preferred mode of the prism row 101 formed on the light guide plate 12 will be described referring to FIGS. 9 to 11.

Figure 9:
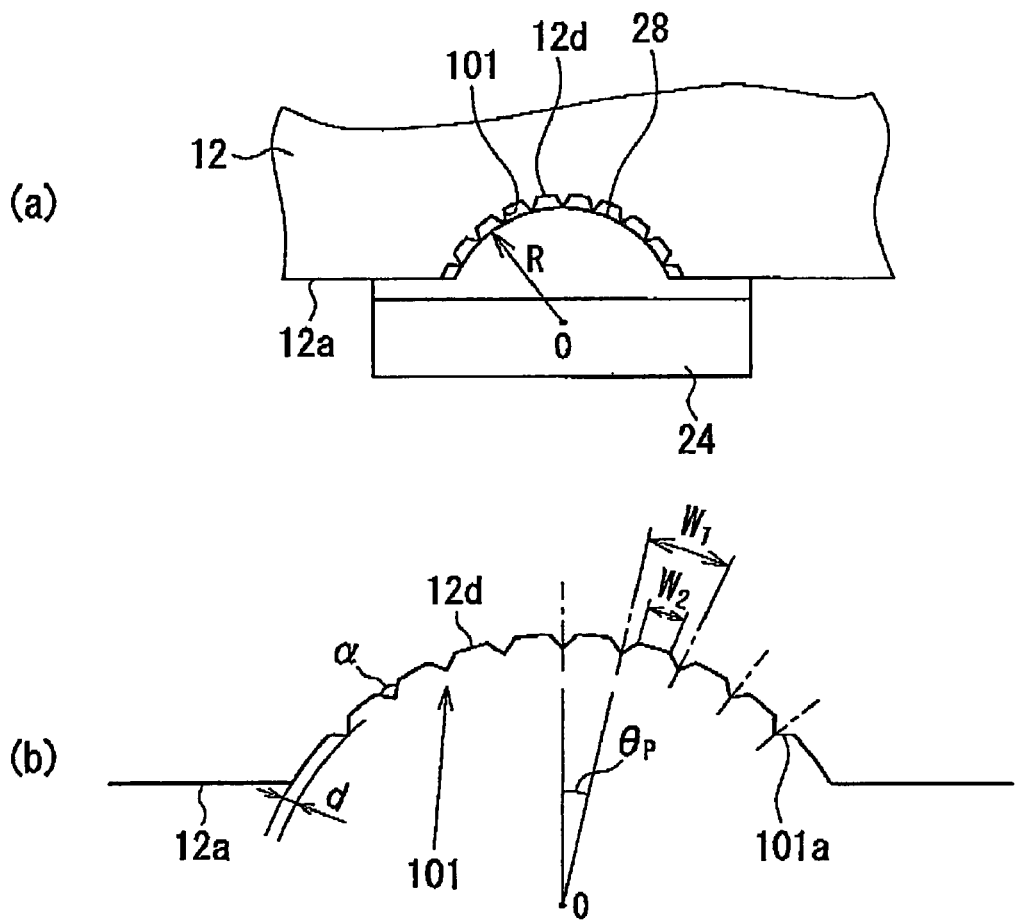

FIG. 9 is a view illustrating a mode of the prism row 101 in this embodiment, in which FIG. 9(a) is a plan view illustrating the notch portion 12d of the light guide plate 12 together with the LED 24 and FIG. 9(b) is a plan view illustrating the notch portion 12d in an enlarged manner.

As shown in FIG. 9(a), on the side end face 12a opposed to the LED 24 of the light guide plate 12, the notch portion 12d following the outline of the projecting portion 28 is formed, and the prism row 101 comprising a plurality of unit prisms 101a extending in a direction crossing the light guide plate 12 are formed on the surface of the notch portion 12d. As mentioned above, in this embodiment, the continuous curved surface constituting the projecting portion 28 of the LED 24 comprises a cylindrical face having a given radius R around a center of curvature O, and the surface of the notch portion 12d comprises a cylindrical face formed concentrically having a radius slightly larger than R. In the mode shown in FIG. 9, the prism row 101 provided on the surface of the notch portion 12d comprises the unit prisms 101a with the outline of the section in the triangular shape, and each unit prism 101a is projected in the direction of the center of curvature O common to the projecting portion 28 and the notch portion 12d and arranged along the circumferential direction of the notch portion 12d.

In the planar illumination device 10 in this embodiment, by connecting the LED 24 and the light guide plate 12 in the above configuration, the projecting portion 28 of the translucent resin of the LED 24 and the light guide plate 12 are brought into close contact and moreover, incident light from the LED 24 is diffused by the prism row 101, light emission distribution of the light incident to the light guide plate from the LED is made wide-angle equivalent to the light emission distribution of the light by the single LED or more, which contributes to more uniform brightness of the planar illumination device. At this time, the prism row 101, as shown in FIG. 9(b), distributes light with a desired intensity in a desired direction by setting an apex angle α of the triangle constituting the outline of the section of the unit prism 101a, the projecting height d of the unit prism, an arrangement pitch $θ_P$ in the circumferential direction when each unit prism 101a is arranged or a prism density (a proportion of the prism portion with respect to the surface of the notch portion 12d, that is, a value defined as (W1−W2)/W1, here) as appropriate.

Figure 10:
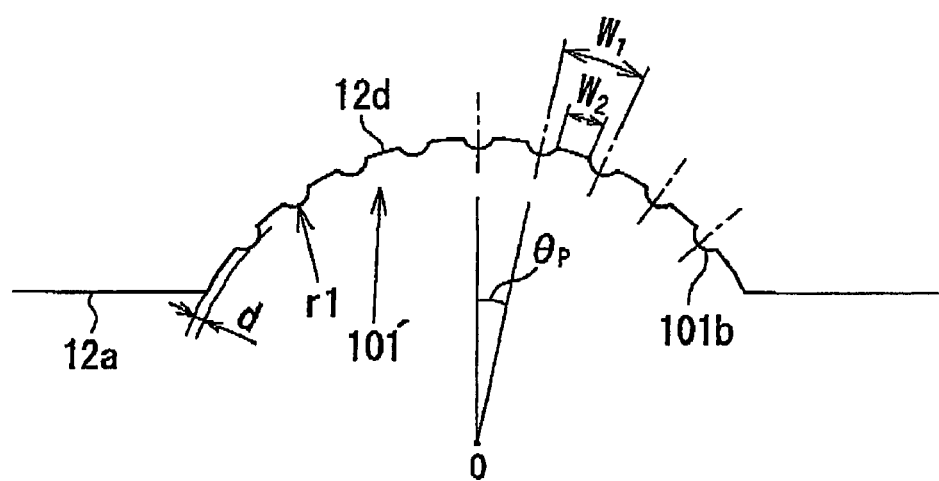
FIG. 10 is a plan view illustrating another form of the notch portion formed at the light guide plate of the planar illumination device according to the embodiment of the present invention in an enlarged manner.

FIG. 10 shows another mode of the prism row in this embodiment and is a plan view illustrating the notch portion 12d in an enlarged manner. In the mode shown in FIG. 10, a prism row 101' provided on the surface of the notch portion 12d comprises a unit prism 101b with the arc-state outline of the section, and each unit prism 101b is projected in the direction of the center of curvature O common to the projecting portion 28 and the notch portion 12d and arranged along the circumferential direction of the notch portion 12d. With the planar illumination device 10 in this embodiment, the same actions/effects as those of the prism row 101 shown in FIG. 9 are obtained by the prism row 101' comprising the unit prisms 101b. The light distribution with the desired intensity in the desired direction is also enabled as in the prism row 101 shown in FIG. 9 by setting the prism row 101' with a radius r1 of an arc constituting the outline of the section of the unit prism 101b, the projecting height d of the unit prism 101b, the arrangement pitch $θ_P$ in the circumferential direction when the unit prisms 101b are arranged or the prism density ((W1−W2)/W1) as appropriate.

Figure 11:
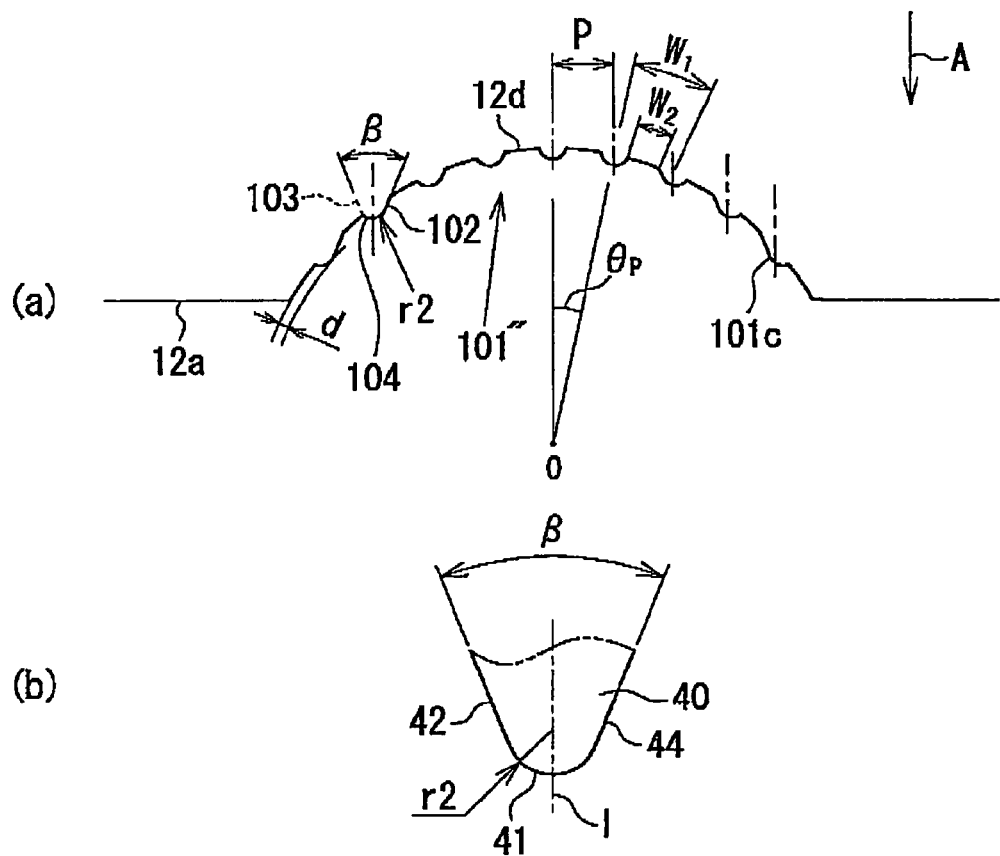
FIG. 11 are plan views illustrating another form of the notch portion formed at the light guide plate of the planar illumination device according to the embodiment of the present invention in an enlarged manner.

FIG. 11 show still another mode of the prism row in this embodiment, in which FIG. 11(a) is a plan view illustrating the notch portion 12d in an enlarged manner, and FIG. 11(b) is a side view illustrating a shape of a turning tool for die machining of the light guide plate shown in FIG. 11(a). In the mode shown in FIG. 11(a), a prism row 101" provided on the surface of the notch portion 12d comprises a unit prism 101c with the outline of the section made of a single straight line 102 and an arc 104 connected to the straight line 102, and each unit prism 101c is projected in a direction (A direction) crossing the side end face 12a and arranged along the circumferential direction of the notch portion 12d. The outline of the unit prism 101c may further have a straight line shown by a virtual line 103 in FIG. 11(a) and may comprise two straight lines 102, 103 and the arc 104 connecting those straight lines at the tip end.

In the planar illumination device 10 in this embodiment, the same actions/effects as those of the prism rows 101, 101' shown in FIGS. 9, 10 are obtained by the prism row 101" comprising the unit prisms 101c. The light distribution of the prism row 101" with the desired intensity in the desired direction is also enabled as in the prism row 101 shown in FIGS. 9 and 10 by setting an inclination angle β/2 of a radius r2 of an arc constituting a part of the outline of the section of the unit prism 101c and the straight line 102 (and the straight line 103, if present) with respect to the A direction, the projecting height d of the unit prism 101c, the arrangement pitch $θ_P$ in the circumferential direction when the unit prism 101c is arranged or the prism density ((W1−W2)/W1) as appropriate.

Here, as a material forming the light guide plate 12, acrylic resin, polycarbonate resin, amorphous polyolefin resin or the like is preferable because of the excellent balance between molding performance and optical characteristics, but instead of the above, a transparent resin such as polystyrene, polyester, polyolefin, fluorine polymer, epoxy resin or the like can be used. Also, injection molding which is excellent in productivity and accuracy is preferable for molding of the light guide plate 12, but various resin molding methods including heat and pressure molding, extrusion molding, cast molding and the like can be applied.

In this embodiment, in order to provide prism row 101, 101', 101" shown in FIGS. 9 to 11 on the light guide plate 12, grooving corresponding to the above-mentioned unit prism 101a, 101b or 101c is applied on the molding die thereof. The present invention is not limited to a specific method but cutting work may be employed using a turning tool machined to the shape corresponding to each of the unit prisms 101a, 101b, 101c. At this time, in the case of the prism row 101, 101' shown in FIGS. 9 and 10, a turning tool having a triangular or a circular blade edge corresponding to the unit prism 101a, 101b, respectively, is used for grooving while a cylindrical portion of the die corresponding to the notch portion 12d is rotated according to the pitch $θ_P$. In the case of the prism row 101" shown in FIG. 11, using a turning tool 40 having the outline of the section comprising a pair of straight lines 42, 44 inclined symmetrically with respect to a center line 1 and an arc 41 connecting the tip ends of the pair of straight lines 42, 44 as shown in FIG. 11(b), while this turning tool is fed by a predetermined pitch P in parallel with the side end face 12a as shown in FIG. 11(a), a groove with a predetermined depth is cut in a direction (A direction) perpendicular to the side end face 12a. This mode is advantageous in terms of manufacturability since the light guide plate 12 and the die can be easily separated after molding regardless of the size of the inclination angle β of the unit prism 101" or the projecting height d.

As a material for the above-mentioned turning tool 40, a single-crystal diamond is preferable but an arbitrary material can be used as long as necessary tool hardness can be obtained.

In the above explanation for the prism rows 101, 101', 101" by referring to FIGS. 9 to 11, each of the unit prisms 101, 101', 101" is described as a projecting streak installed upright on the surface of the notch portion 12d of the light guide plate 12, but the prism row according to the present invention may be a recess streak recessed to have the outline of the section in the same shape. Also, the notch portion 12d of the light guide plate 12 may be formed following the outline of the projecting portion 28 and the base portion 29 of the LED 24 so that both the projecting portion 28 and the base portion 29 of the LED 24 are fitted in the notch portion 12d.

Figure 12:
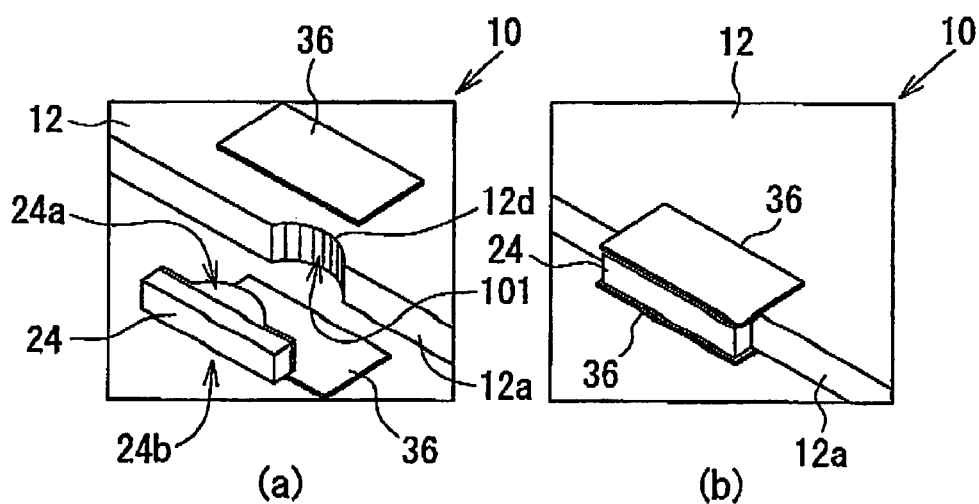

Moreover, as shown in FIGS. 12(a) and 12(b), a reflector 36 may be arranged along side faces 24a, 24b in a direction parallel to the light guide plate 12 of the LED 24 (upper and lower faces in the example in FIG. 12). As the reflector 36, a reflector in which a metal thin film with high reflectivity such as aluminum, silver and the like is formed on a thin resin substrate is preferable in terms of slimness and reflection characteristics but a reflector with high optical reflectivity formed by applying a white or milky white paint on a thin resin base, a white resin board made of a resin mixed with a white pigment, or a metal thin plate with high reflectivity such as aluminum, silver and the like may be used. Also, by keeping the thickness at 100 μm or less, the thickness of the entire planar illumination device 10 can be kept as small as possible. Also, the shape of the reflector 36 is preferably a rectangle which can fully cover the entire LED 24 as shown in the figure, when considering productivity, but a shape such that the projecting portion 28 of the LED 24 only is covered, for example, can obtain a necessary effect.

The planar illumination device according to the embodiments of the present invention can be also applied both to a so-called back light and front light.

EXAMPLES

Action exerted by the embodiments of the present invention will be described below based on FIGS. 13 and 14.

FIGS. 13 and 14 are graphs illustrating measurement results of light emission distribution of six examples of the planar illumination device according to the present invention. In all the examples, the used LED 24 has the projecting portion 28 (See FIG. 2) with a cylindrical face of R=0.9 mm, H=0.4 mm, H/R=0.44, and as shown in FIG. 9(a), the notch portion 12d formed concentrically with the projecting portion 28 and having a cylindrical surface with a radius of 1.0 mm is provided on the side end face 12a of the light guide plate 12.

Example 1

The prism row in the example 1 corresponds to the prism row 101 shown in FIG. 9(b) having the apex angle α=90°, the arrangement pitch in the circumferential direction $\theta_P=4°$, and a prism density of 50% (at this time, the projecting height d=approximately 15 μm).

Example 2

The prism row in the example 2 corresponds to the prism row 101 shown in FIG. 9(b) having the apex angle α=90°, the arrangement pitch in the circumferential direction $\theta_P=4°$, and a prism density of 80% (at this time, the projecting height d=approximately 25 μm).

Example 3

The prism row in the example 3 corresponds to the prism row 101 shown in FIG. 9(b) having the apex angle α=60°, the arrangement pitch in the circumferential direction $\theta_P=4°$, and a prism density of 50%.

Example 4

The prism row in the example 4 corresponds to the prism row 101 shown in FIG. 9(b) having the apex angle α=60°, the arrangement pitch in the circumferential direction $\theta_P=4°$, and a prism density of 80%.

Example 5

The prism row in the example 5 corresponds to the prism row 101' shown in FIG. 10 having the radius r1=0.05 mm, the arrangement pitch in the circumferential direction $\theta_P=12°$, and the projecting height d of approximately 40 μm).

Example 6

The prism row in the example 6 corresponds to the prism row 101' shown in FIG. 11a having the radius r2=0.04 mm, the arrangement pitch in the circumferential direction $\theta_P=12°$, and the projecting height d of approximately 40 μm).

Comparative Example

As a comparative example, a light guide plate on which a prism row is not provided on the surface of the notch portion 12d is used.

FIG. 13(a) is a graph illustrating the intensity ratio of the light emission distribution after light incidence to the light guide plate 12 from the LED 24 for the Example 1, Example 2, Example 3, Example 4, and the Comparative Example with the front direction of the LED 24 at θ=0°, and FIG. 13(b) is a graph illustrating a wide-angle area (A part) in FIG. 13(a) in an enlarged manner. As can be seen from FIG. 13, in any of the Examples 1 to 4, the intensity ratio of the front direction is lowered as compared with the Comparative Example, while the intensity ratio in the wide-angle direction (|θ|≧approximately 70°) is increased and as a result, it is known that uniformity of the light emission distribution is improved and brightness in the wide-angle direction is increased.

Also, at least in the measurement example shown in FIG. 13, when the Example 1 is compared with the Example 2 (and the Example 3 with the Example 4), the more the prism density increases, the larger the degree of diffusion of the light from the θ=0° direction. When the Example 1 is compared with the Example 3 (and the Example 2 with the Example 4), it is known that the sharper the apex angle of the triangle the more the degree of the above diffusion action is increased. As described above, in the present invention, by setting the shape of each unit prism and the arrangement of the unit prisms as appropriate, the light can be distributed in a desired direction with a desired intensity. Considering brightness of the entire planar illumination device, extreme lowering of the intensity ratio in the θ=0° direction is not necessarily preferable and in the case of Examples, when a light guide plate with the size of 30 mm×40 mm is used with a single LED arranged on its short side (30 mm), for example, the prism row in Example 1 is optimal, while when a single LED is arranged on its long side (40 mm), the prism row in Example 2 is optimal.

FIG. 14(a) is a graph illustrating the light emission distribution similar to FIG. 13 for Example 1, Example 2, Example 5, Example 6, and Comparative Example, and FIG. 14(b) is a graph illustrating a wide-angle area (A part) shown in FIG. 14(a) in an enlarged manner. According to FIG. 14, it is known that both Example 5 and Example 6 have the same actions/effects as those of the above-mentioned Example 1 and Example 2.

The invention claimed is:

1. A planar illumination device provided with a plate-like light guide plate and an LED arranged on a side end face of the light guide plate, characterized in that the LED has no lamp house, a translucent resin that seals an LED chip is exposed, an outline of the translucent resin is formed into a continuous curved surface constituting a projecting portion with a cylindrical face, a notch portion is formed on the side end face of the light guide plate where opposed to the LED, the notch portion following the outline of the projecting portion, a prism row composed of a plurality of unit prisms extending in a direction crossing the light guide plate is provided on the surface of the notch portion, and the projecting portion is fitted into the notch portion.

2. The planar illumination device according to claim 1, wherein each of the unit prisms are formed as a projecting streak or a recess streak and the side face of the projecting streak or the recess streak comprises a flat face, a curved face or a combination thereof.

3. The planar illumination device according to claim 1, wherein the prism row is formed by arranging each of the unit prisms projected or recessed in a direction of a center of curvature of the notch portion, and by arranging each of the unit prisms along the circumferential direction of the notch portion.

4. The planar illumination device according to claim 1, wherein the prism row is formed by arranging each of the unit prisms projected or recessed in a direction crossing the side end face of the light guide plate opposed to the LED, and by arranging each of the unit prisms along the circumferential direction of the notch portion so that each of the unit prisms are arranged in parallel to each other.

5. The planar illumination device according to claim 1, wherein the prism row includes each of the unit prisms with the outline of the section being substantially triangular.

6. The planar illumination device according to claim 1, wherein the prism row includes each of the unit prisms with the outline of the section being substantially arc.

7. The planar illumination device according to claim 1, wherein the prism row includes each of the unit prisms, the unit prisms being formed out of a groove, the groove having a curvature shape such that at least a portion of the groove forms a straight surface and at least of a portion of the groove forms an arced surface.

8. The planar illumination device according to claim 1, wherein a reflector is arranged along the side face in a direction parallel with the light guide plate of the LED.

9. The planar illumination device according to claim 1, wherein the LED is formed so as to have a value obtained by dividing the projecting height by a radius of the projecting portion to be in a range of 0.3 or more and 0.6 or less, and to have the radius of the projecting portion being obtained by multiplying a length when the LED chip is projected in the direction crossing the light guide plate by 1.5 or more.

* * * * *